United States Patent [19]

Akimoto

[11] Patent Number: 5,614,025
[45] Date of Patent: Mar. 25, 1997

[54] PLASMA PROCESSING APPARATUS

[75] Inventor: Takeshi Akimoto, Tokyo, Japan

[73] Assignee: NEC Corporation, Tokyo, Japan

[21] Appl. No.: 351,517

[22] Filed: Dec. 7, 1994

[30] Foreign Application Priority Data

Dec. 13, 1993 [JP] Japan .................. 5-311408

[51] Int. Cl.$^6$ .................................. C23C 16/00
[52] U.S. Cl. .................. 118/723 MP; 118/723 MW; 118/723 ME; 118/723 E
[58] Field of Search .............. 118/723 E, 723 MW, 118/723 MP, 723 ME; 156/345; 204/298.38

[56] References Cited

U.S. PATENT DOCUMENTS

| 4,985,109 | 1/1991 | Otsubo | 156/345 |
| 5,017,404 | 5/1991 | Paquet | 427/45.1 |
| 5,134,965 | 8/1992 | Tokuda | 118/723 |
| 5,284,544 | 2/1994 | Mizutani | 156/345 |
| 5,304,250 | 4/1994 | Sameshima | 118/723 ER |
| 5,364,519 | 11/1994 | Fujimura | 204/298.38 |
| 5,439,715 | 8/1995 | Okamura | 427/575 |

FOREIGN PATENT DOCUMENTS 4-343421  11/1992  Japan .

Primary Examiner—R. Bruce Breneman
Assistant Examiner—Joni Y. Chang
Attorney, Agent, or Firm—Sughrue, Mion, Zinn, Macpeak & Seas

[57] ABSTRACT

A plasma processing apparatus for processing wafers or similar objects with neutral particles produced from plasma. A microwave is introduced into the apparatus via a dielectric path, or waveguide, having a broad radiation area. The microwave, therefore, generates uniform and dense plasma over a broad area. Neutral particles are produced from the plasma by two electrodes. As a result, an object is processed at a high speed by a beam of uniformly distributed neutral particles.

1 Claim, 2 Drawing Sheets 5,614,025

PLASMA PROCESSING APPARATUS

BACKGROUND OF THE INVENTION

The present invention relates to a plasma processing apparatus for processing wafers or similar objects with neutral particles produced from plasma.

In the semiconductor devices art, dry etching is extensively used to process wafers or similar objects accurately. It is a common practice with a dry etching apparatus to excite etching gas by a high frequency power source so as to generate plasma. Chemically active particles produced from the plasma are incident upon the surface of a wafer in the form of a beam. Among the active particles, ions are accelerated by an electric field and caused to impinge on the surface of the wafer. This implements highly anisotropic etching and allows patterns to be processed with accuracy. However, the problem with etching using charged ions is that the surface of the wafer charged and destroys a semiconductor device due to the charge-up thereof, thereby degrading the reliability of such a device. Therefore, to effect reliable etching while insuring high anisotropy, active particles of the same orientation and electrically neutral are essential.

A conventional plasma processing apparatus of the kind etching an object with neutral active particles is disclosed in, for example, Japanese Patent Laid-Open Publication No. 4-343421. This kind of apparatus has a plasma chamber into which etching gas is admitted in order to generate plasma, an etching chamber for etching an object disposed therein with neutral particles produced from the plasma, and a micro channel plate separating such two chambers and formed with micro channels for allowing the neutral particles from moving from the plasma chamber to the etching chamber in the form of a neutral beam. With such an apparatus, however, a sufficient plasma density is not achievable in the plasma chamber. Hence, the density of ions and that of active particles available with the apparatus are too low to meet the increasing demand for higher etching speeds or processing speeds.

SUMMARY OF THE INVENTION

It is, therefore, an object of the present invention to provide a plasma processing apparatus capable of processing an object at a high speed with uniform neutral particles.

It is another object of the present invention to provide a plasma processing apparatus capable of generating plasma in a high density.

A plasma processing apparatus for processing an object with neutral particles produced from plasma of the present invention has a chamber having an inlet for admitting processing gas and an outlet for discharging it, a plasma chamber defined in the chamber for generating plasma, a processing chamber for accommodating the object to be processed, a cathodic electrode member formed with a plurality of minute apertures and separating the plasma chamber and processing chamber, a flat dielectric path member facing the plasma chamber, a microwave generating device for feeding a microwave to the dielectric path member, an anodic electrode member formed with a plurality of radiation ports for radiating the microwave, and a power source for applying a voltage to between the cathodic electrode member and the anodic electrode member.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
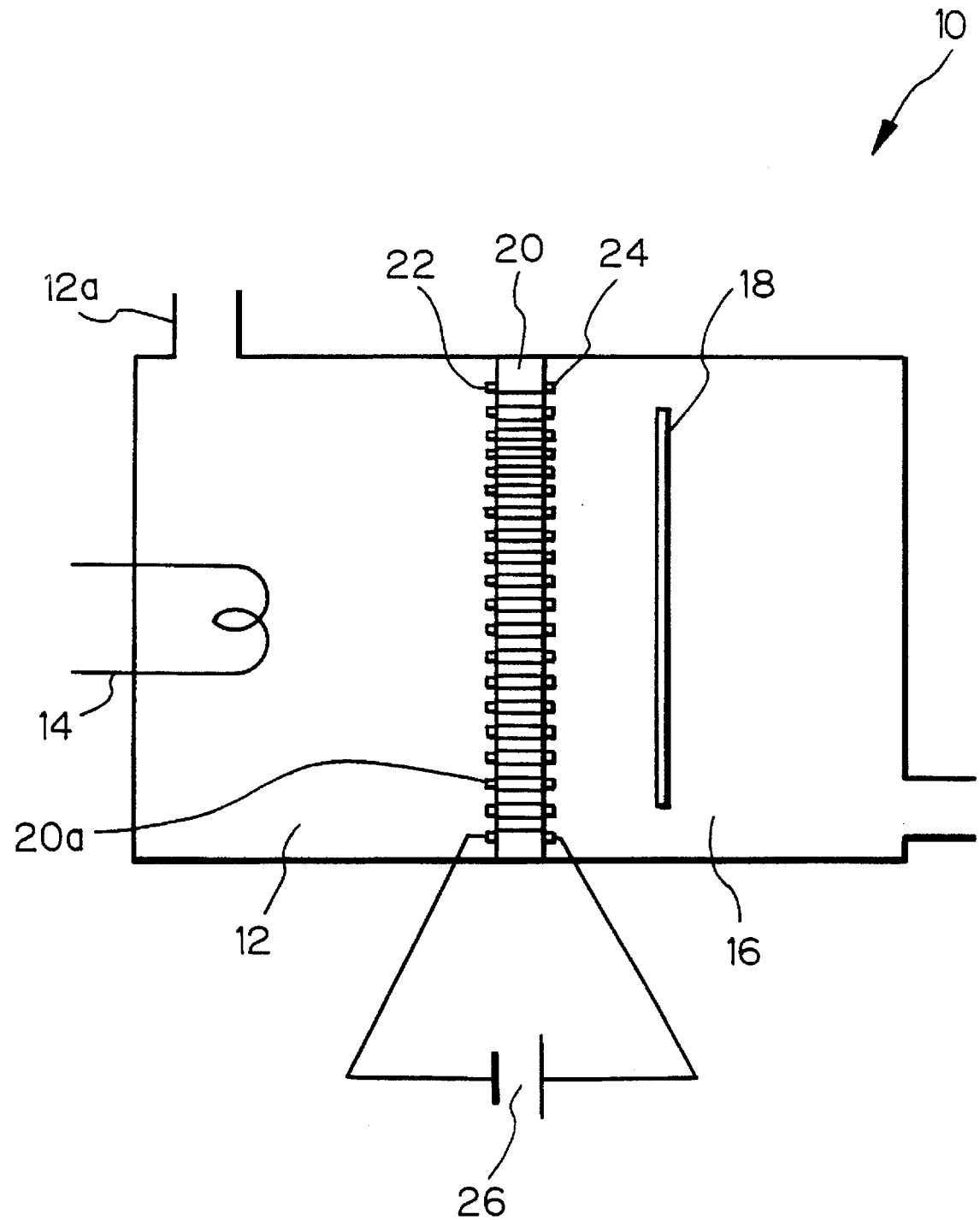
FIG. 1 is a section showing a conventional plasma processing apparatus.

To better understand the present invention, a brief reference will be made to a conventional plasma processing apparatus, shown in FIG. 1. The apparatus to be described is of the type taught in previously mentioned Japanese Patent Laid-Open Publication No. 4-343421. As shown, the apparatus, generally 10, has a plasma chamber 12 and an etching chamber 16 which are partitioned by a micro channel plate 20. Etching gas is introduced into the plasma chamber 12 via an inlet 12a. A high frequency power source 14 generates plasma out of the etching gas. A semiconductor or similar object 18 to be etched is accommodated in the etching chamber 16. The micro channel plate 20 is formed with a number of small apertures, or micro channels, 20a. First surface electrodes 22 and second surface electrodes 24 are mounted on opposite sides of the micro channel plate 20. A power source 26 applies a voltage to between the first and second electrodes 22 and 24 in order to multiply electrons.

In operation, the high frequency power source 14 produces plasma out of the etching gas admitted into the plasma chamber 12 via the inlet 12a. At the same time, a voltage is applied from the electron multiplying power source 14 to between the electrodes 22 and 24. As a result, radicals and other neutral particles contained in the plasma are incident to the object 18 via the micro channels 20a as a neutral beam. The other positive ions are neutralized by an electron multiplying effect particular to the micro channels 20a and then also incident to the object 18 in the form of a neutral beam. In this manner, the conventional apparatus 10 etches the object 18 with neutral particles.

Why the positive ions are neutralized in the micro channels 20a is as follows. Free electrons or ions existing in the plasma chamber 12 are admitted into the micro channels 20a to generate secondary electrons. Consequently, the number of electrons in the micro channels 20a is noticeably increased due to the electron multiplying effect. Ions in the micro channels 20a are again coupled with such electrons and neutralized thereby.

The problem with the conventional apparatus 10 is that a sufficient plasma density is not achievable in the plasma chamber 12, as discussed earlier. Hence, the density of ions and that of active particles available with the apparatus 10 are too low to implement an etching speed or processing speed acceptable in practice.

Figure 2:
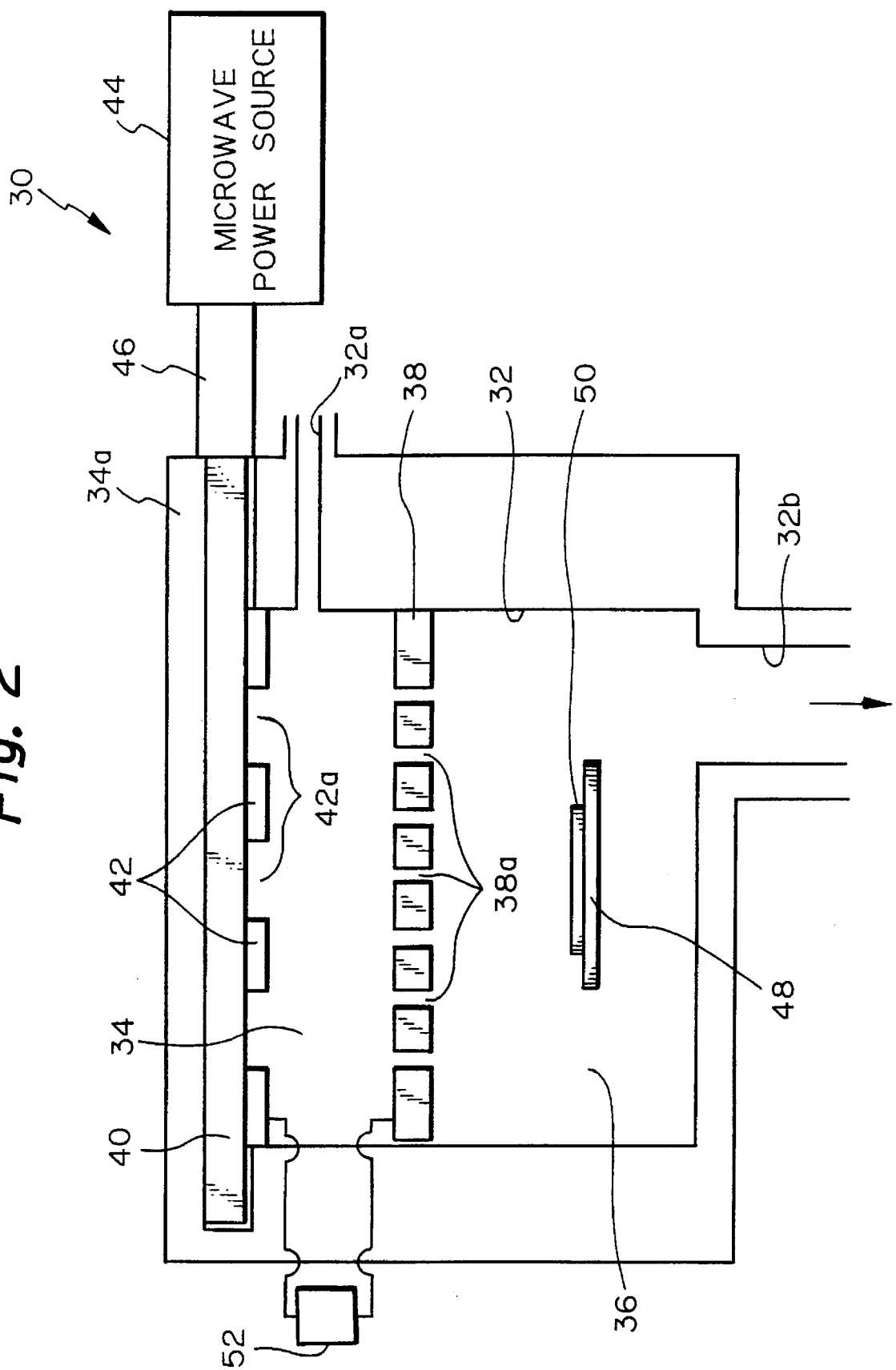
FIG. 2 is a section showing a plasma processing apparatus embodying the present invention.

Referring to FIG. 2, a plasma processing apparatus embodying the present invention is shown and generally designated by the reference numeral 30. As shown, the apparatus 30 has a chamber 32 divided into a plasma chamber 34 and a processing chamber 36 by a lower electrode 38. The lower electrode 38 is formed with a number of small apertures 38a. Processing gas is introduced into the chamber 32 via an inlet 32a and discharged therefrom via an outlet 32b. The upper end of the chamber 32 is closed by a lid 34a. A plate 40 is made of Teflon™ (polytetrafluoroethylene) and held in contact with the lid 34a so as to play the role of a dielectric path 40. An upper electrode 42 covers the plate 40 and has a plurality of radiation ports 42a for radiating a microwave. A microwave power source 44 is connected to one end of the dielectric path 40 by a waveguide 46. A table 48 is disposed below the lower electrode 38 and loaded with a wafer, or object, 50 to be processed. A DC power source 52 applies a voltage to between the upper and lower electrodes 42 and 38.

In operation, processing gas is admitted into the plasma chamber 34 via the inlet 32a. At the same time, a microwave is uniformly introduced into the plasma chamber 34 via the radiation ports 42a which are distributed over a broad range. As a result, plasma is generated in the plasma chamber 34 in a high density. Active particles contained in the plasma are transferred from the plasma chamber 34 to the processing chamber 36 via the apertures 38a of the lower electrode 38. The DC power source 52 provides the lower electrode 38 and the upper electrode 42 with negative polarity and positive polarity, respectively. In this condition, ions passing through the apertures 38a of the lower electrode 38 are accelerated toward the table 48. When the ions passing through the apertures 38a impinge on the lower electrode, or cathode, 38, they generate secondary electrons and again coupled therewith. These ions or the ions derived from the discharge of Auger electrons are neutralized and accelerated downward as a beam of neutral particles.

As stated above, in the illustrative embodiment, a microwave radiated over a broad range serves as plasma generating means. This realizes a plasma density of $10^{12}/cm^3$ which is two orders of magnitude higher than the conventional density of $10^{10}/cm^3$. Hence, the neutralized ions are uniformly distributed in a high density, implementing a high etching speed.

In summary, the present invention provides a plasma processing apparatus capable of processing an object at a high speed with a beam of uniformly distributed neutral particles. This unprecedented advantages is derived from a microwave which is introduced into the apparatus via a dieletric path, or waveguide, having a broad radiation area.

The microwave, therefore, generates uniform and dense plasma over a broad area. Neutral particles are produced from the plasma by two electrodes.

Various modifications will become possible for those skilled in the art after receiving the teachings of the present disclosure without departing from the scope thereof. For example, even when the DC power source 52 is replaced with a high frequency power source, an object can be desirably processed by the neutral particles, as determined by experiments.

What is claimed is:

1. A plasma processing apparatus for processing an object with neutral particles produced from plasma, comprising:

a plasma generating chamber;

a processing chamber accommodating the object to be processed;

a dielectric path member facing said plasma generating chamber;

a microwave generator for feeding a microwave to said dielectric path member;

a first electrode member formed between said plasma generating chamber and said processing chamber and having a plurality of minute aperture;

a second electrode member mounted on said dielectric path member within said plasma generating chamber and having a plurality of radiation ports for radiating the microwave therethrough; and a power source for applying a voltage to between said first electrode member and said second electrode member;

whereby said plasma chamber produces plasma including ion particles between said first electrode member and said second electrode member, and said first electrode member converts said ion particles to said neutral particles.

* * * * *